United States Patent
Yamamoto et al.

(10) Patent No.: US 8,436,365 B2
(45) Date of Patent: May 7, 2013

(54) SIC SEMICONDUCTOR DEVICE HAVING SCHOTTKY BARRIER DIODE AND METHOD FOR MANUFACTURING THE SAME

(75) Inventors: Takeo Yamamoto, Obu (JP); Takeshi Endo, Toyota (JP); Jun Morimoto, Nisshin (JP); Hirokazu Fujiwara, Miyoshi (JP); Yukihiko Watanabe, Nagoya (JP); Takashi Katsuno, Nisshin (JP); Tsuyoshi Ishikawa, Nisshin (JP)

(73) Assignees: DENSO CORPORATION, Kariya (JP); Toyota Jidosha Kabushiki Kaisha, Toyota (JP)

(*) Notice: Subject to any disclaimer, the term of this patent is extended or adjusted under 35 U.S.C. 154(b) by 34 days.

(21) Appl. No.: 13/031,280

(22) Filed: Feb. 21, 2011

(65) Prior Publication Data
US 2011/0204383 A1    Aug. 25, 2011

(30) Foreign Application Priority Data
Feb. 23, 2010    (JP) .................................... 2010-37388

(51) Int. Cl.
H01L 29/16    (2006.01)
H01L 29/47    (2006.01)
H01L 29/872   (2006.01)

(52) U.S. Cl.
USPC ...... 257/77; 257/485; 257/E29.068; 438/478; 977/773

(58) Field of Classification Search .................. None
See application file for complete search history.

(56) References Cited

U.S. PATENT DOCUMENTS

| | | | | |
|---|---|---|---|---|
| 5,019,530 | A * | 5/1991 | Kleinsasser et al. | 438/572 |
| 5,652,437 | A * | 7/1997 | Harris | 257/77 |
| 5,789,311 | A | 8/1998 | Ueno et al. | |
| 6,844,251 | B2 * | 1/2005 | Shenai et al. | 438/571 |
| 7,138,668 | B2 * | 11/2006 | Hayashi et al. | 257/183 |
| 7,262,434 | B2 * | 8/2007 | Okamura et al. | 257/77 |
| 7,781,786 | B2 * | 8/2010 | Hayashi et al. | 257/94 |

(Continued)

FOREIGN PATENT DOCUMENTS

| | | |
|---|---|---|
| JP | A-H8-264812 | 10/1996 |
| JP | A-2003-332562 | 11/2003 |
| JP | A-2006-120761 | 5/2006 |
| JP | A-H8-316172 | 11/2006 |

OTHER PUBLICATIONS

Sarit Dhar, Shurui Wang, John R. Williams, Sokrates T. Pantelides and Leonard C. Feldman (2005). Interface Passivation for Silicon Dioxide Layers on Silicon Carbide. MRS Bulletin, 30, pp. 288-292.*

(Continued)

Primary Examiner — Thomas L Dickey
Assistant Examiner — Joseph Schoenholtz
(74) Attorney, Agent, or Firm — Posz Law Group, PLC (57) ABSTRACT

A SiC semiconductor device having a Schottky barrier diode includes: a substrate made of SiC and having a first conductive type, wherein the substrate includes a main surface and a rear surface; a drift layer made of SiC and having the first conductive type, wherein the drift layer is disposed on the main surface of the substrate and has an impurity concentration lower than the substrate; a Schottky electrode disposed on the drift layer and has a Schottky contact with a surface of the drift layer; and an ohmic electrode disposed on the rear surface of the substrate. The Schottky electrode directly contacts the drift layer in such a manner that a lattice of the Schottky electrode is matched with a lattice of the drift layer.

14 Claims, 9 Drawing Sheets

U.S. PATENT DOCUMENTS

| | | | |
|---|---|---|---|
| 7,816,733 B2* | 10/2010 | Okuno et al. | 257/339 |
| 7,838,888 B2* | 11/2010 | Yamamoto et al. | 257/77 |
| 7,851,882 B2* | 12/2010 | Okuno et al. | 257/472 |
| 7,863,682 B2* | 1/2011 | Okuno et al. | 257/339 |
| 7,893,467 B2* | 2/2011 | Yamamoto et al. | 257/280 |
| 2005/0045892 A1* | 3/2005 | Hayashi et al. | 257/77 |
| 2005/0045982 A1* | 3/2005 | Shenai | 257/481 |
| 2005/0224838 A1* | 10/2005 | Tanaka et al. | 257/187 |
| 2008/0258152 A1* | 10/2008 | Yamamoto et al. | 257/77 |
| 2009/0160008 A1* | 6/2009 | Fujiwara et al. | 257/471 |
| 2009/0236611 A1 | 9/2009 | Yamamoto et al. | |
| 2009/0243026 A1* | 10/2009 | Nakamura et al. | 257/471 |
| 2009/0278169 A1* | 11/2009 | Hayashi et al. | 257/183 |
| 2011/0250736 A1 | 10/2011 | Ohta et al. | |

OTHER PUBLICATIONS

Pereztomas, A., M. Jennings, M. Davis, V. Shah, T. Grasby, J. Covington, and P. Mawby. "High Doped MBE Si P-n and N-n Heterojunction Diodes on 4H-SiC." Microelectronics Journal 38.12 (2007): 1233-237.*

H.Tanaka, T.Hayashi, Y.Shimoida, S.Yamagami, S.Tanimoto, and M.Hoshi "Ultra-Low Von and High Voltage 4H-SiC Heterojunction Diode", ISPSD2005, pp. 287-290.*

Saxena, V.; Jian Nong Su; Steckl, A.J.;, "High-voltage Ni- and Pt-SiC Schottky diodes utilizing metal field plate termination," Electron Devices, IEEE Transactions on , vol. 46, No. 3, pp. 456-464, Mar. 1999.*

H. Fujiwara, T. Kimoto, T. Tojo, and H. Matsunami, "Characterization of in-grown stacking faults in 4H-SiC (0001)epitaxial layers and its impacts on high-voltage Schottky barrier diodes", Appl. Phys. Lett. 87, 051912 (2005).*

D. Alok, R. Egloff and E. Arnold, "Effect of Surface Preparation and Thermal Anneal on Electrical Characteristics of 4H-SiC Schottky Barrier Diodes," Materials Science Forum, vols. 264-268 (1998), pp. 929-932.

* cited by examiner

SIC SEMICONDUCTOR DEVICE HAVING SCHOTTKY BARRIER DIODE AND METHOD FOR MANUFACTURING THE SAME

CROSS REFERENCE TO RELATED APPLICATION

This application is based on Japanese Patent Application No. 2010-37388 filed on Feb. 23, 2010, the disclosure of which is incorporated herein by reference.

FIELD OF THE INVENTION

The present invention relates to a SiC semiconductor device having a Schottky barrier diode and a method for manufacturing a SiC semiconductor device having a Schottky barrier diode.

BACKGROUND OF THE INVENTION

Conventionally, in JP-A-2003-332562, a break down voltage of a SiC semiconductor device having a Schottky barrier diode (i.e., SBD) is improved. In the device, a micro pipe defect and a small defect disposed in a single crystal substrate made of SiC are filled with an oxide film so that these defects are recovered. Thus, a Schottky electrode does not directly contacts the micro pipe defect and the small defect, so that an electric field intensity is reduced, and a leak current is limited. Thus, the break down voltage of the device is improved.

Figure 7:
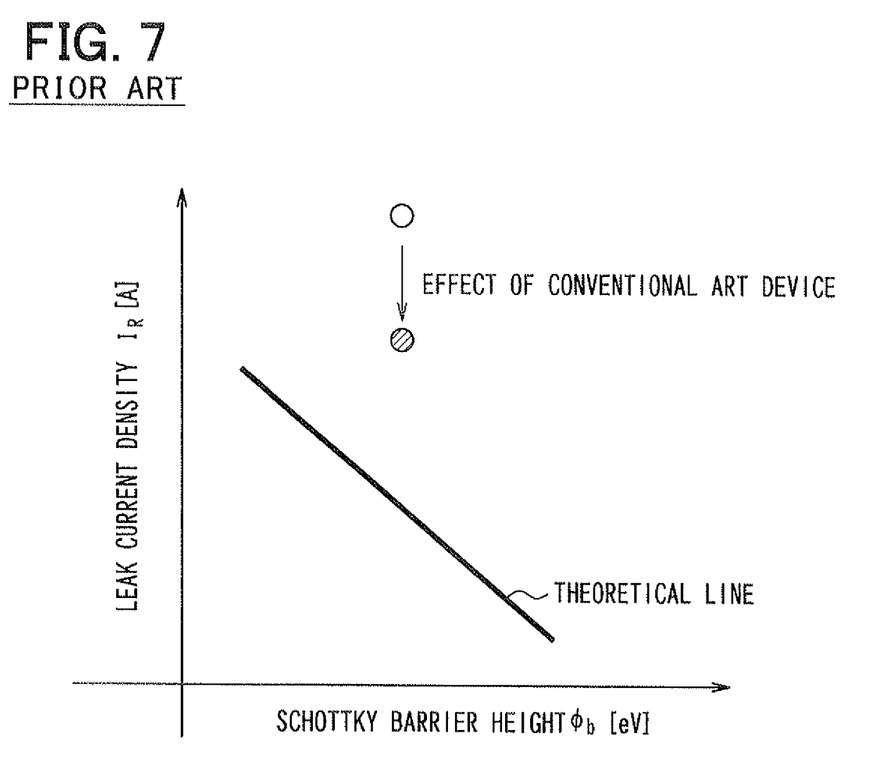
FIG. 7 is a graph showing the conventional art device in the relationship between the Schottky barrier height φb and the leak current $I_R$ with respect to a theoretical line.

However, in the above conventional art, even when the micro pipe defect and the small defect are filled with the oxide film, the leak current is not sufficiently reduced. FIG. 7 shows a relationship between a leak current density $I_R$ and a Schottky barrier height $\phi b$. Specifically, in FIG. 7, a theoretical line is shown, and a white circle in a comparison device and a black circle in the above device are also shown. The white circle represents a case where the micro pipe defect and the small defect are not filled with the oxide film, and the black circle represents a case where the micro pipe defect and the small defect are filled with the oxide film. The leak current density of the above device, i.e., the black circle is reduced, compared with the leak current density of the comparison device, i.e., the white circle. However, the leak current density is not sufficiently reduced in the above device. Thus, it is possible to reduce the leak current density so as to reach the theoretical line. Accordingly, it is required to improve the leak current much more so as to reach the theoretical line.

Here, as shown in FIG. 7, when the Schottky barrier height $\phi b$ is small, the leak current density $I_R$ becomes large. Thus, the relationship between the Schottky barrier height $\phi b$ and the leak current density $I_R$ is a trade off relationship. Accordingly, it is difficult to reduce both of the Schottky barrier height $\phi b$ and the leak current density $I_R$. However, it is required to approach the relationship to the theoretical line.

SUMMARY OF THE INVENTION

In view of the above-described problem, it is an object of the present disclosure to provide a SiC semiconductor device having a Schottky barrier diode. It is another object of the present disclosure to provide a method for manufacturing a SiC semiconductor device having a Schottky barrier diode. In the SiC semiconductor device, both of a Schottky barrier height $\phi b$ and a leak current density $I_R$ are improved.

According to a first aspect of the present disclosure, a SiC semiconductor device having a Schottky barrier diode includes: a substrate made of SiC and having a first conductive type, wherein the substrate includes a main surface and a rear surface; a drift layer made of SiC and having the first conductive type, wherein the drift layer is disposed on the main surface of the substrate and has an impurity concentration lower than the substrate; a Schottky electrode disposed on the drift layer and has a Schottky contact with a surface of the drift layer; and an ohmic electrode disposed on the rear surface of the substrate. The Schottky electrode directly contacts the drift layer in such a manner that a lattice of the Schottky electrode is matched with a lattice of the drift layer.

In the above device, a boundary layer made of SiOx is not formed between the Schottky electrode and the drift layer. Thus, the Schottky electrode and the surface of the drift layer are aligned in lattice so that atomic arrangement of the Schottky electrode is continuously connected to the surface of the drifty layer. Thus, both of the Schottky barrier height $\phi b$ and the leak current density $I_R$ are improved.

According to a second aspect of the present disclosure, a manufacturing method of a SiC semiconductor device having a Schottky barrier diode includes: preparing a substrate made of SiC and having a first conductive type, wherein the substrate includes a main surface and a rear surface; forming an ohmic electrode on the rear surface of the substrate; forming a drift layer on the main surface of the substrate, wherein the drift layer is made of SiC and has the first conductive type, and an impurity concentration of the drift layer is lower than the substrate; and forming a Schottky electrode on the drift layer after the forming of the ohmic electrode, wherein the Schottky electrode has a Schottky contact with a surface of the drift layer. The forming of the Schottky electrode includes: depositing the Schottky electrode at temperature equal to or lower than 150° C.; and annealing the Schottky electrode at temperature equal to or lower than 900° C.

In the above method, since the Schottky electrode is deposited at temperature equal to or lower than 150° C., the diameter of grains in the Schottky electrode becomes small, so that the grain has a granular structure. Further, since the annealing temperature of the Schottky electrode is equal to or lower than 900° C., the grain of the Schottky electrode is not changed from the granular structure to the columnar structure. Thus, the boundary layer made of SiOx is not formed between the Schottky electrode and the drift layer. Thus, the Schottky electrode and the surface of the drift layer are aligned in lattice so that atomic arrangement of the Schottky electrode is continuously connected to the surface of the drifty layer. Thus, both of the Schottky barrier height $\phi b$ and the leak current density $I_R$ are improved.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 8A:
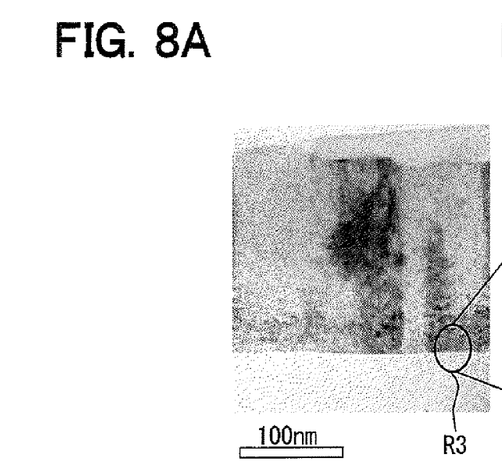
FIG. 8A is a diagram showing a cross sectional TEM image of the boundary between a SiC material and a Schottky electrode in a comparison SiC semiconductor device having a SBD.
Figure 8B:
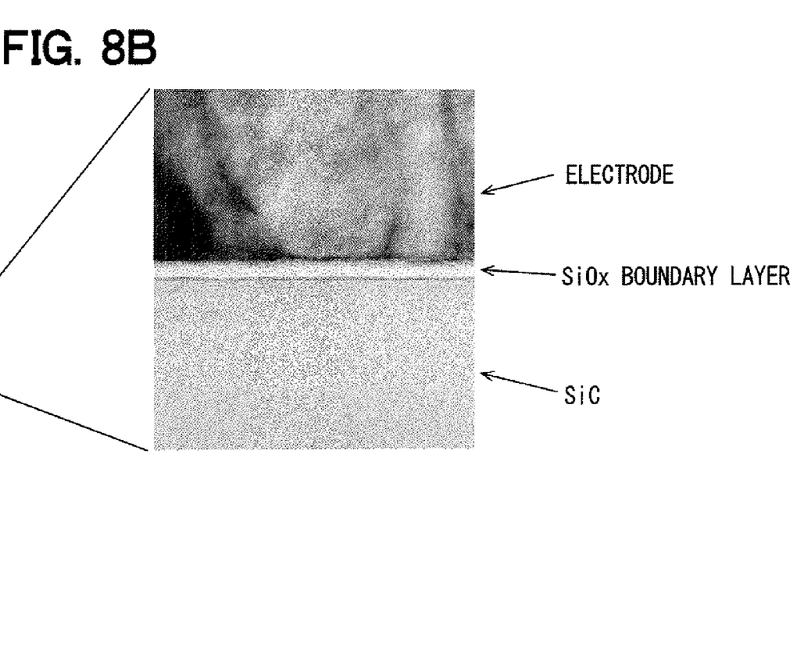
FIG. 8B is a diagram showing a partially enlarged cross sectional view of a boundary region R3 in FIG. 8A.
Figure 8C:
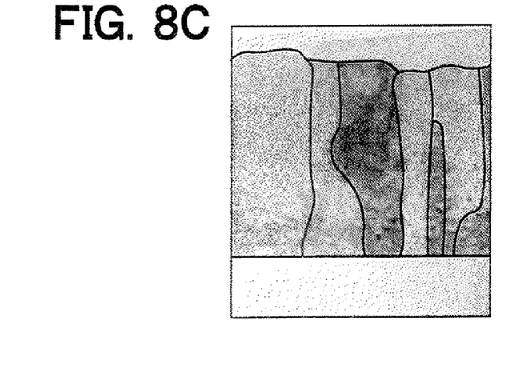
FIG. 8C is a diagram showing an outline of a grain structure in the TEM image of FIG. 8A, and FIGS. 8D to 8F are diagrams showing schematic views of FIGS. 8A to 8C, respectively.
Figure 8D:
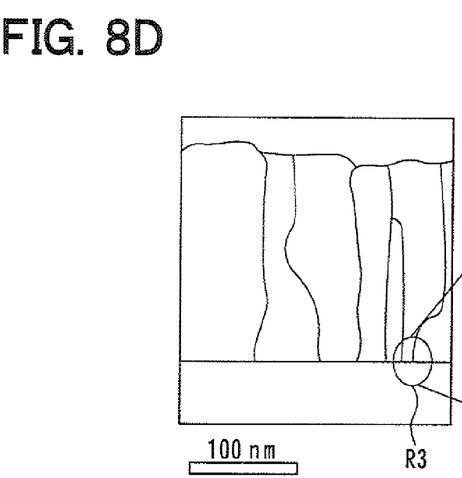
Figure 8E:
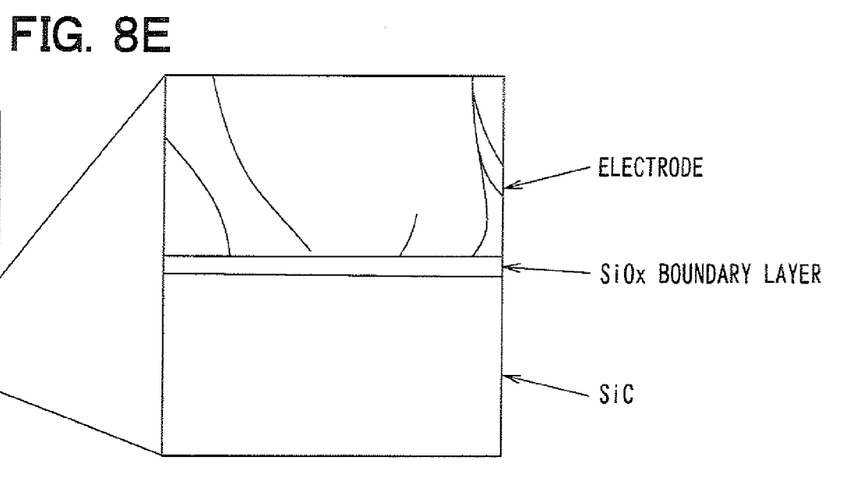
Figure 8F:
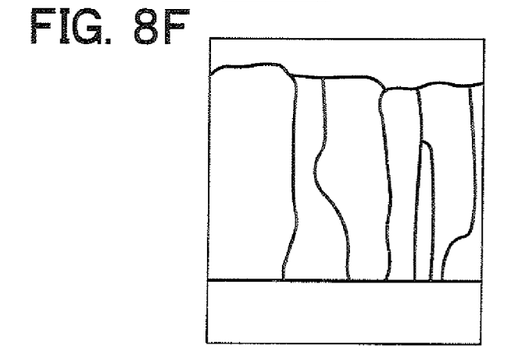

The present inventors have studied about a SiC semiconductor device having a SBD. The inventors have discovered that generation of a leak current relates to a state of a boundary between a Schottky electrode and SiC material. FIG. 8A shows a cross sectional TEM (transmission electron microscope) image near a boundary between SiC material and a Schottky electrode in a comparison SiC semiconductor having a SBD. FIG. 8D is a schematic view of FIG. 8A. FIG. 8C shows an outline of a grain structure in the TEM image of FIG. 8A, and FIG. 8F is a schematic view of FIG. 8C. FIG. 8B shows a partially enlarged cross sectional view of a region R3 in FIG. 8A, and FIG. 8E is a schematic view of FIG. 8B. A thin boundary layer is formed at a boundary between the SiC material and the Schottky electrode. The boundary layer has a different character from the SiC material and the Schottky electrode. The boundary layer is analyzed by a EELS (electron energy-loss spectroscopy). A peak, which corresponds to a coupling between silicon and oxygen, is observed in the EELS profile. Accordingly, the boundary layer is made of SiOx. Thus, the inventors consider that the leak current increases because of existence of the boundary layer made of a silicon oxide film.

Figure 9:
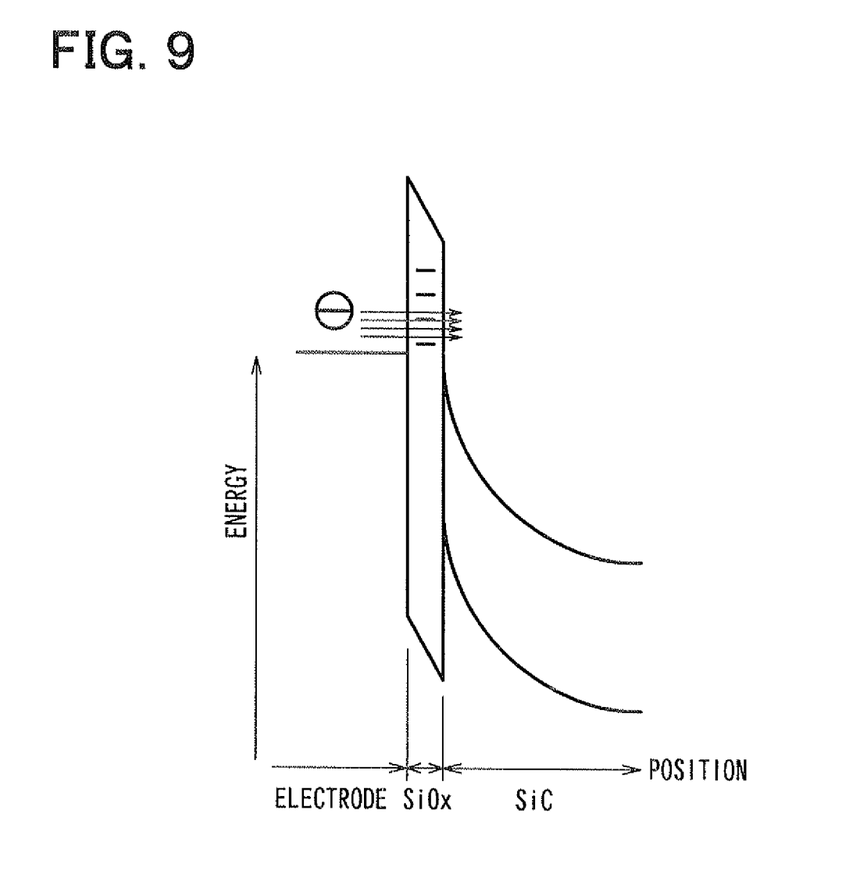
FIG. 9 is a diagram showing an energy band structure near the boundary layer between the SiC material and the Schottky electrode in a leak current increase model.

FIG. 9 shows an energy band image in a leak current increase model when the boundary layer is disposed at the boundary between the SiC material and the Schottky electrode. As shown in FIG. 9, since the SiOx layer having an irregular structure and a small amount of carbon is disposed between the Schottky electrode and the SiC material, a trap level is generated in the SiOx layer. Thus, the band structure near the boundary with the boundary layer is different from the band structure at the boundary without the boundary layer. Thus, a tunnel current increases from a low voltage applied region when a reverse voltage is applied at the boundary, so that the leak current may increase.

Although a way of forming the boundary layer is not obvious, since the oxygen is not disposed at the boundary between the Schottky electrode and the SiC material originally, it is considered that the residual oxygen in a chamber is introduced and concentrated at the boundary, or the oxygen disposed in the Schottky electrode is introduced and concentrated at the boundary. In the conventional boundary structure in the SBD, as shown in FIG. 8B, the grain structure of metal in the Schottky electrode has a columnar structure, which extends in a direction perpendicular to the surface of the SiC material. Thus, it is considered that the oxygen is easily concentrated at the boundary between the SiC material and the Schottky electrode through a grain boundary in the metal.

(First Embodiment)

Figure 1:
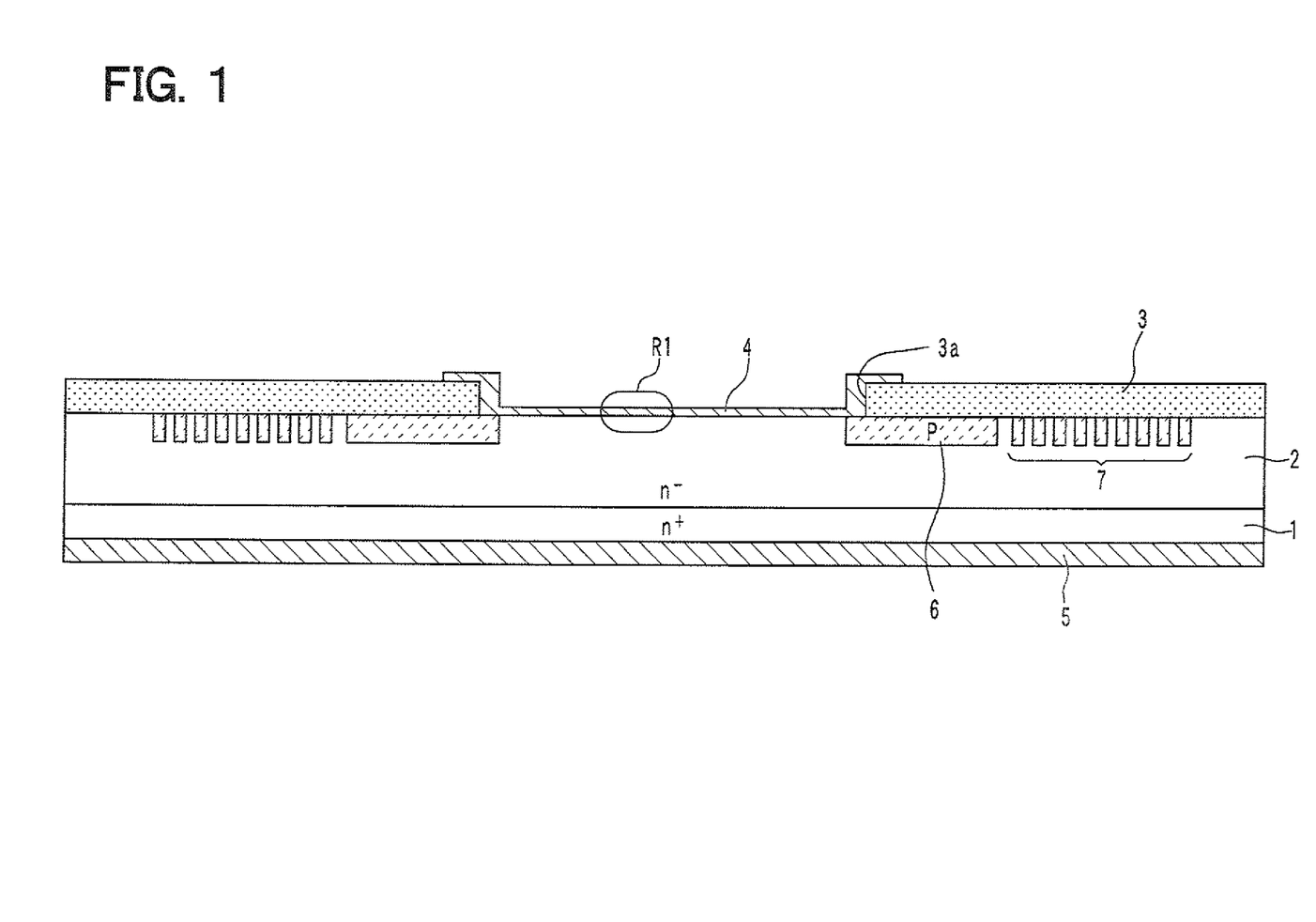
FIG. 1 is a diagram showing a cross sectional view of a SiC semiconductor device having a SBD according to a first embodiment.

A first embodiment will be explained. FIG. 1 shows a cross sectional view of a SiC semiconductor device according to the present embodiment.

As shown in FIG. 1, the SiC semiconductor device is formed from a SiC substrate 1 having a N+ conductive type. The impurity concentration of the substrate 1 is in a range between $2 \times 10^{18}$ cm$^{-3}$ and $1 \times 10^{21}$ cm$^{-3}$. The substrate 1 is made of 4H—SiC, 6H—SiC, 3C—Sic or 15R—SiC. The substrate 1 is an offset substrate with an offset angle. For example, the offset angle with respect to a (000-1) C-plane or a (0001) Si plane is four degrees or eight degrees, and the substrate 1 is made of 4H—SiC.

An upper surface of the substrate 1 is defined as a principal surface 1a, and a lower surface of the substrate opposite to the principal surface 1a is defined as a rear surface 1b. A drift layer 2 having a N− conductive type and made of SiC is formed on the principal surface 1a of the substrate 1. The impurity concentration, i.e., a dopant concentration of the drift layer 2 is lower than the substrate 1. For example, the impurity concentration of the drift layer 2 is $5 \times 10^{15}$ cm$^{-3}$ (±50%). The SBD is formed in a cell region of the substrate 1 and the drift layer 2. Further, a terminal structure is disposed in a periphery region of the substrate 1. Thus, the SiC semiconductor device is prepared.

Specifically, an insulation film 3 made of, for example, a silicon oxide film is formed on the surface of the drift layer 2 in the cell region. The insulation film 3 includes an opening 3a partially. A Schottky electrode 4 is formed I the opening 3a of the insulation film 3 so that the Schottky electrode contacts the drifty layer 2. The thickness of the Schottky electrode 4 is in a range between 100 nm and 500 nm. In the present disclosure, the Schottky electrode 4 is made of molybdenum (i.e., Mo). Alternatively, the Schottky electrode 4 may be made of titanium (i.e., Ti), nickel (i.e., Ni), or tungsten (i.e., W). Alternatively, the Schottky electrode 4 may be made of gold (i.e., Au) or platinum (i.e., Pt) in view of electric coupling with a bonding wire. Further, the Schottky electrode 4 may be made of molybdenum or alloy of these metals. Thus, the Schottky electrode 4 may be formed from a single structure or a multi-layered structure of metal or alloy.

Figure 2:
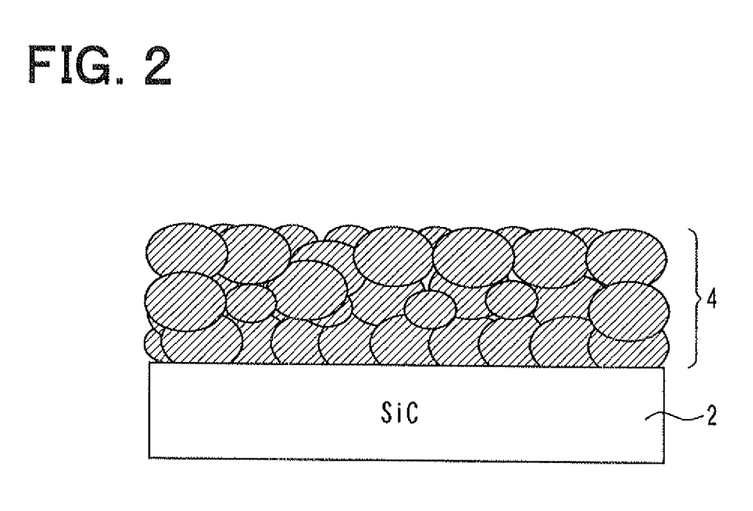
FIG. 2 is a diagram showing a partially enlarged cross sectional view of a boundary region R1 between a SiC material and a Schottky electrode in FIG. 1.
Figure 3A:
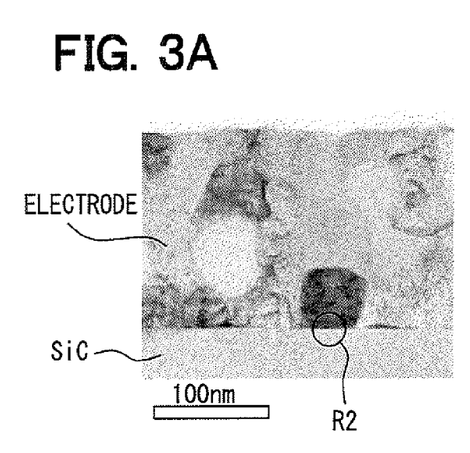
FIG. 3A is a diagram showing a cross sectional TEM image of the boundary region R1 in FIG. 1.
Figure 3B:
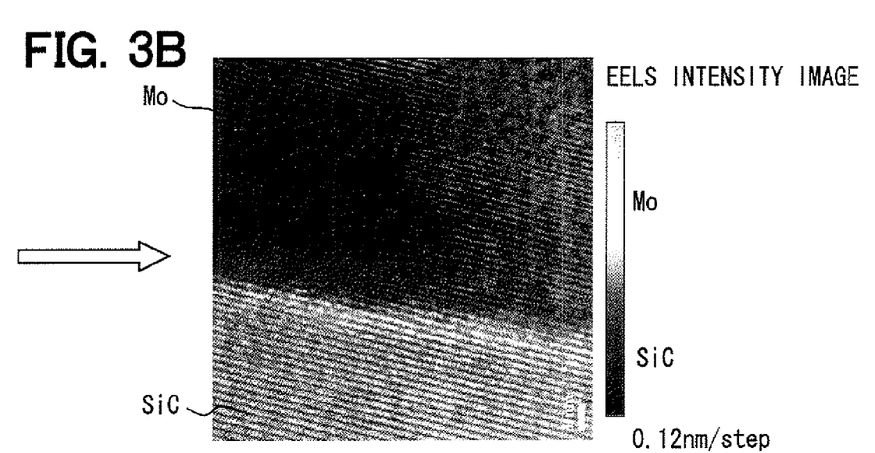
FIG. 3B is a diagram showing a partially enlarged cross sectional view of a region R2 in FIG. 3A, and FIGS. 3C and 3D are diagrams showing schematic views of FIGS. 3A and 3B, respectively.
Figure 3C:
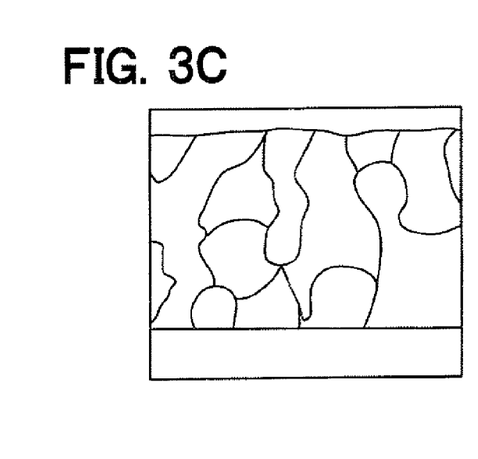
Figure 3D:
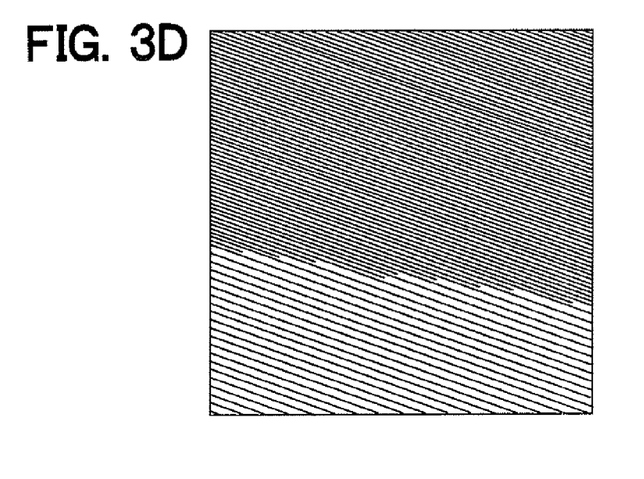

FIG. 2 shows a region R1 in FIG. 1, which is a boundary portion between the drift layer 2 as the SiC material and the Schottky electrode 4. FIGS. 3A and 3C show a cross sectional TEM image of the region R1. FIG. 3B shows an analysis image of the region R2 in FIG. 3A by an electron energy-loss spectroscopy. A fine structure of the Schottky electrode 4 and a bonding state between the drift layer 2 and the Schottky electrode 4 will be explained.

As shown in FIGS. 2, 3A and 3B, no silicon oxide film made of SiOx is not formed at the boundary between the Schottky electrode 4 and the drift layer. Specifically, no SiOx is observed at the boundary between the SiC material and the Schottky electrode 4. Thus, the Schottky electrode directly contacts the SiC material, i.e., the drift layer 2. Further, as shown in FIGS. 2 and 3A, the grain structure of the Schottky electrode 4 is not a columnar structure but a granular structure. A diameter of each grain is smaller than a thickness of the Schottky electrode 4, i.e., a ratio between the diameter of the grains and the thickness of the Schottky electrode 4 is smaller than 1.0. Specifically, the diameter of each grain is equal to or smaller than 100 nm. Furthermore, the grain of molybdenum in the Schottky electrode 4 has a (110)-orientation. The grain of the Schottky electrode 4 and the surface of the SiC material are aligned in lattice (i.e., lattice matched) so that atomic arrangement of the grain of the Schottky electrode 4 is continuously connected to the surface of the SiC material.

The thickness of the Schottky electrode 4 may be smaller than 100 nm. However, it is preferred that the thickness of the Schottky electrode 4 is sufficiently thick in order to form the granular structure of the grains in the Schottky electrode 4. Here, in a case where the diameter of the grains in the Schottky electrode 4 is small, even when the thickness of the Schottky electrode 4 is small, the granular structure is formed. Thus, the thickness of the Schottky electrode 4 may be determined according to the diameter of the grains in the Schottky electrode 4. Since a warpage may be generated in the Schottky electrode 4 when the thickness of the Schottky electrode 4 is too thick. In view of the warpage, the thickness of the Schottky electrode 4 is set to be equal to or smaller than 500 nm.

The opening 3a of the insulation film 3 has a circular shape. The Schottky electrode 4 in the opening 3a is connected to the drift layer 2 with Schottky connection. An ohmic electrode 5 is formed on the rear surface 1b of the substrate 1. The ohmic electrode 5 is made of nickel, titanium, molybdenum, tungsten or the like. Thus, the SBD is prepared.

The device includes a terminal structure disposed in an outer periphery region of the SBD. In the terminal structure, a RESURF (i.e., reduced surface field) layer 6 having a P conductive type is formed in a surface portion of the drift layer 2 on both sides of the Schottky electrode 4 so that the RESURF layer 6 contacts the Schottky electrode 4. Multiple guard ring layers 7 are also arranged in a surface portion of the drift layer 2. The guard ring layers 7 surround the outside of the RESURF layer 6. Thus, the terminal structure is prepared. The RESURF layer 6 includes an impurity such as aluminum. The impurity concentration of the RESURF layer 6 is in a range between 5×1016 cm-3 and 1×1018 cm-3. The RESURF layer 6 and the guard ring layers 7 have a ring shape, which surrounds the cell region. Since the device includes the terminal structure, the electric field expands widely on the outer periphery of the SBD, so that the electric field concentration is reduced. Thus, the breakdown voltage of the device is improved.

Here, the device includes only the SBD. Alternatively, the device may include a JBS (i.e., junction barrier Schottky diode) such that a P conductive type layer contacting the Schottky electrode 4 with ohmic contact is formed on the inside of an inner side of the RESURF layer 6, which is disposed on an utmost inside of the RESURF layer 6, i.e., disposed on a cell region side of the RESURF layer 6.

In the SiC semiconductor device having the SBD, the Schottky electrode 4 provides an anode, and the ohmic electrode 5 provides a cathode. When the voltage exceeding the Schottky barrier is applied to the Schottky electrode 4, the current flows between the Schottky electrode 4 and the ohmic electrode 5.

Next, a manufacturing method of the SiC semiconductor device will be explained. FIGS. 4A to 4E shows the manufacturing method of the device. In FIGS. 4A to 4E, the guard ring layers 7 are not shown.

Figure 4A:
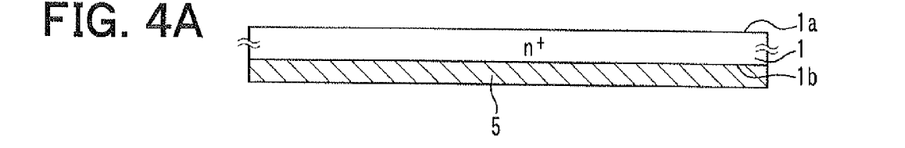
FIGS. 4A to 4E are diagrams showing a manufacturing method of SiC semiconductor device in FIG. 1.

In FIG. 4A, for example, the substrate 1 made of 4H—SiC and having the offset angle of four or eight degrees with respect to the (000-1) c-plane or the (0001) Si-plane is prepared. A metal film made of nickel, titanium, molybdenum, tungsten or the like is formed on the rear surface 1b of the substrate 1. Then, the metal film is annealed at 1000° C. or higher, so that the metal film contacts the substrate 1 with an ohmic contact. Thus, the ohmic electrode 5 is formed. A forming step of the ohmic electrode 5 may be performed later. However, it is not preferable to perform a thermal process at 900° C. or higher because a metal grain of the Schottky electrode 4 does not provide a columnar structure. Accordingly, when the ohmic electrode 5 is formed before the Schottky electrode 4 is formed, the grain structure of the Schottky electrode 4 does not provide the columnar structure.

Figure 4B:
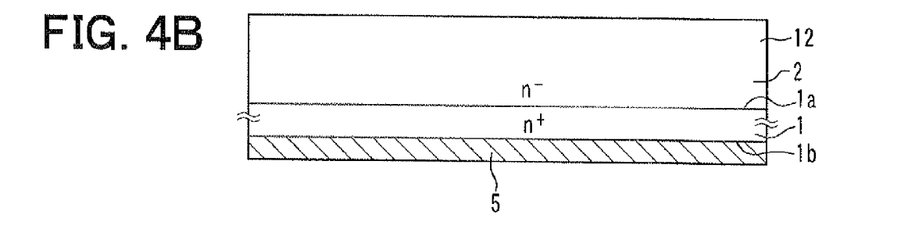

In FIG. 4B, the drift layer 2 having the N– conductive type is epitaxially grown on the principal surface 1a of the substrate 1. The dopant concentration of the drift layer 2 is lower than the substrate 1. Specifically, the dopant concentration of the drift layer 2 is $5 \times 10^{15}$ cm$^{-3}$ (±50%).

Figure 4C:
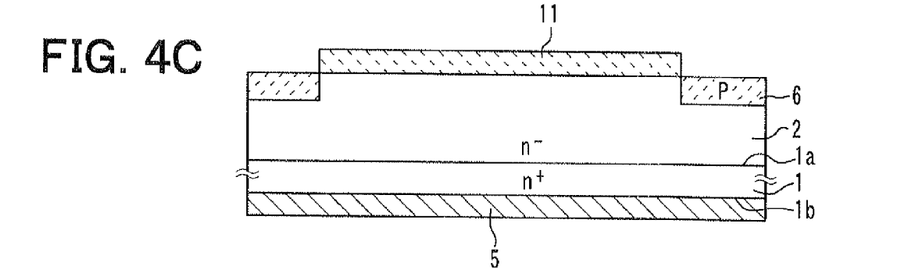

In FIG. 4C, a mask 11 made of a LTO (i.e., low-temperature oxide) film or the like is arranged on the drift layer 2. A part of the mask 11 corresponding to the RESURF layer 6 and the guard ring layers 7 is opened in a photo-lithography process. Then, a P conductive type impurity is ion-implanted via the mask 11 having an opening corresponding to the RESURF-layer-to-be-formed region and an opening corresponding to the guard-ring-layer-to-be-formed region. Then, the substrate 1 is annealed so that the impurity is activated. Thus, the RESURF layer 6 and the guard ring layers 7 are formed.

Figure 4D:
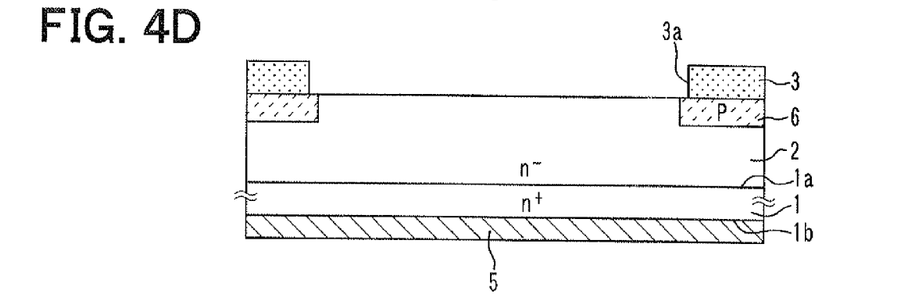

In FIG. 4D, after the mask 11 is removed. Then, a silicon oxide film is deposited by, for example, a plasma CVD method. The silicon oxide film is reflowed so that the insulation film 3 is formed. Then, the insulation film 3 is etched in a photography etching process. Thus, the opening 3a is formed in the insulation film 3.

Figure 4E:
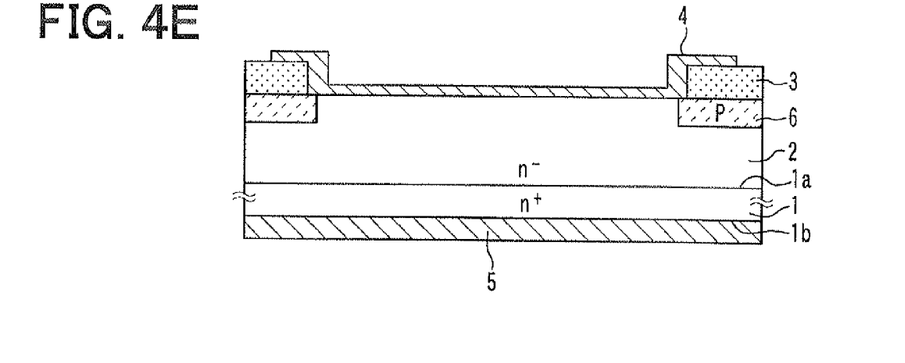

In FIG. 4E, the Schottky electrode 4 is formed in the opening 3a and on the insulation film 3. At this time, a metal grain of the Schottky electrode 4 is arranged on the surface of the SiC material such that the atomic arrangement of the grain of the Schottky electrode 4 is continuously coupled with the SiC material. Thus, the Schottky electrode 4 and the drift layer 2 are lattice aligned (lattice matched).

For example, the substrate 1 after the insulation film 3 is formed is arranged in a chamber of an evaporation apparatus. Then, molybdenum is deposited on the drift layer 2 in the chamber having oxygen atmosphere. The molybdenum provides the Schottky electrode 4. When an evaporation temperature is high, the state of the molybdenum film changes from an amorphous state to a crystal state so that the grain structure of the molybdenum film for forming the Schottky electrode 4 becomes the columnar structure. Thus, it is preferred that the molybdenum film is deposited at a temperature equal to or lower than 150° C. When a deposition temperature is set to be equal to or lower than 150° C., the diameter of each grain of the molybdenum film is small. For example, the diameter of the grains is equal to or smaller than 100 nm. Further, when a deposition rate of the molybdenum in the evaporation process is high, the grain structure of the molybdenum film for forming the Schottky electrode 4 becomes the columnar structure. In an experimental results performed by the present inventors, when the deposition rate of the molybdenum in the evaporation process is equal to or lower than 10.0 nm/min, the grain structure of the molybdenum film becomes the granular structure, not the columnar structure.

Then, the thermal process is performed. The anneal temperature is equal to or lower than 900° C. When the anneal temperature is higher than 900° C., the grain of the Schottky electrode 4 is made large, and the grain structure may be changed from the granular structure to the columnar structure. Thus, the anneal is performed at a temperature equal to or lower than 900° C., so that the boundary layer made of SiOx is not formed between the Schottky electrode 4 and the drift layer 2, i.e., the SiC material.

Thus, since the above formation method of the Schottky electrode 4 is performed, the boundary layer made of SiOx is not formed at the boundary between the Schottky electrode 4 and the SiC material. The grain of the Schottky electrode 4 and the surface of the SiC material are aligned in lattice so that atomic arrangement of the grain of the Schottky electrode 4 is continuously connected to the surface of the SiC material. Thus, the grain structure of the molybdenum film is not the columnar structure but the granular structure. Thus, since the oxygen is not easily introduced and concentrated at the boundary between the Schottky electrode 4 and the SiC material via the grain boundary, the boundary layer is not formed at the boundary between the Schottky electrode 4 and the SiC material. Thus, the molybdenum film for providing the Schottky electrode 4 and the SiC material as the drift layer 2 are lattice aligned. Further, since the substrate 1 is an offset substrate, an atomic step exposed on the principal surface 1a of the substrate 1 is inherited to the surface of the drift layer 2. Thus, the grain of the molybdenum film as the drift layer 2 is lattice aligned on the atomic step of the substrate 1. For example, when the substrate 1 is made of 4H—SiC and has the offset angle of four degrees, the molybdenum grain and the SiC material are sufficiently aligned in lattice. Thus, the SiC semiconductor device having the SBD is completed.

Here, in the present embodiment, the Schottky electrode 4 is made of molybdenum. Alternatively, the Schottky electrode 4 may be made of other metal or alloy. Further, the Schottky electrode 4 may have a single layered structure or a multi-layered structure. Specifically, when the Schottky electrode 4 is made of molybdenum, which is easily oxidized, it is preferred that a protection film made of for example, a metal film or an alloy film, is formed on the molybdenum film in order to prevent oxidization. The metal film and the alloy film for preventing the oxidization have low reactivity with respect to the oxygen. For example, the metal having low reactivity with respect to the oxygen lower than the molybdenum is nickel, gold, platinum or the like. Further, the Schottky electrode 4 may be made of high purity metal or alloy. Alternatively, the Schottky electrode 4 may be made of metal or alloy with additives. For example, when silicon is mixed as the additive, the grain structure of the metal film becomes the granular structure easily.

In the SiC semiconductor device according to the present embodiment, the boundary layer is not formed at the boundary between the Schottky electrode 4 and the drift layer 2 as the SiC material. Instead, the metal grain of the Schottky electrode 4 and the surface of the SiC material are aligned in lattice so that atomic arrangement of the grain of the Schottky electrode 4 is continuously connected to the surface of the SiC material.

Figure 5:
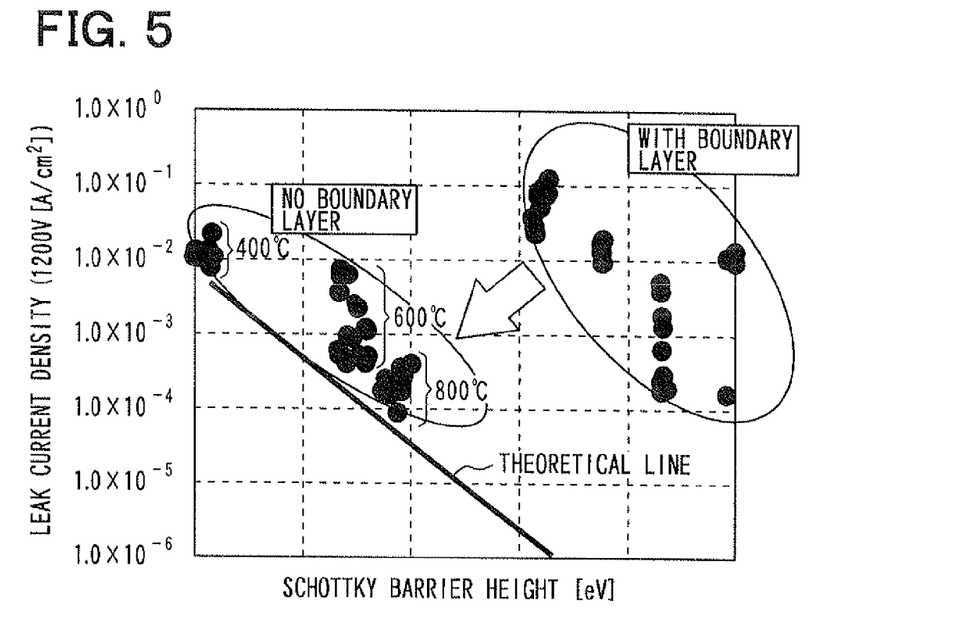
FIG. 5 is a graph showing a relationship between a Schottky barrier height φb and a leak current $I_R$ of the device without a boundary layer and a comparison device with the boundary layer when a reverse bias voltage of 1200 volts is applied to the boundary between the Schottky electrode and the SiC material.
Figure 6:
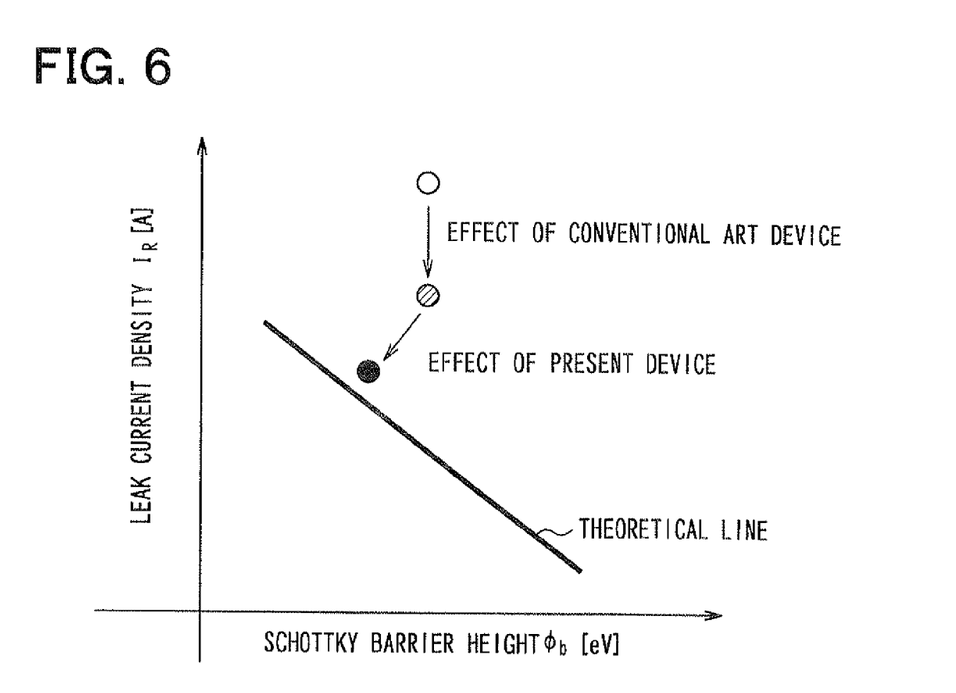
FIG. 6 is a graph showing an effect of a conventional art device and an effect of a present device in the relationship between the Schottky barrier height φb and the leak current $I_R$.

The relationship between the leak current density $I_R$ and the Schottky barrier height $\phi b$ in the device according to the present embodiment without any boundary layer and a comparison device with the boundary layer is studied in a case where the reverse bias voltage of 1200 volts is applied to the devices. The results are shown in FIG. 5. Further, FIG. 6 shows the effect of the conventional art device as the comparison device with the boundary layer and the effect of the device according to the present embodiment without the boundary layer. Here, in FIG. 5, the thermal process temperature in the device according to the present embodiment is varied at 400° C., 600° C. and 800° C., respectively.

As shown in FIGS. 5 and 6, the leak current density $I_R$ and the Schottky barrier height $\phi b$ in the device according to the present embodiment without any boundary layer are reduced as a whole, compared with the comparison device with the boundary layer. Accordingly, compared with a device shown as a white circle in FIG. 6, in which the micro pipe defect and the small defect are not filled with the oxide film, the comparison device shown as a shaded circle, in which the micro pipe defect and the small defect are filled with the oxide film, has a small leak current $I_R$. Compared with the comparison device shown as the shaded circle, the device according to the present embodiment shown as a black circle in FIG. 6 has the leak current $I_R$, which is nearer the theoretical line than the comparison device.

Thus, when the grain of the Schottky electrode 4 and the surface of the SiC material are aligned in lattice so that atomic arrangement of the grain of the Schottky electrode 4 is continuously connected to the surface of the SiC material, both of the leak current density $I_R$ and the Schottky barrier height $\phi b$ are reduced in the SiC semiconductor device having the SBD.

(Other Embodiments)

In the above embodiment, the Schottky electrode 4 is formed by a deposition method with using an evaporation apparatus so that the Schottky electrode 4 is formed from the molybdenum film. Alternatively, the Schottky electrode 4 may be formed by other methods so that the grain of the Schottky electrode 4 and the surface of the SiC material are aligned in lattice so that atomic arrangement of the grain of the Schottky electrode 4 is continuously connected to the surface of the SiC material. For example, the Schottky electrode 4 may be formed by a sputtering method. In this case, the sputtering conditions are adjusted so that the grain of the Schottky electrode 4 and the surface of the SiC material are aligned in lattice so that atomic arrangement of the grain of the Schottky electrode 4 is continuously connected to the surface of the SiC material.

In the above device, the terminal structure is formed in the outer periphery region. Alternatively, the device may not have the terminal structure. Instead, as long as the device includes the main elements of the SBD, i.e., as long as the device includes the substrate 1, the drift layer 2, the Schottky electrode 4 and the ohmic electrode 5, the above effects are obtained.

In the above device, the N conductive type provides the first conductive type, and the P conductive type provides the second conductive type. Alternatively, the P conductive type may provide the first conductive type, and the N conductive type may provide the second conductive type.

In the above embodiment, when an orientation of crystal structure is shown, a bar is added in front of a numeral although the bar should be added over the numeral.

The above disclosure has the following aspects.

According to a first aspect of the present disclosure, a SiC semiconductor device having a Schottky barrier diode includes: a substrate made of SiC and having a first conductive type, wherein the substrate includes a main surface and a rear surface; a drift layer made of SiC and having the first conductive type, wherein the drift layer is disposed on the main surface of the substrate and has an impurity concentration lower than the substrate; a Schottky electrode disposed on the drift layer and has a Schottky contact with a surface of the drift layer; and an ohmic electrode disposed on the rear surface of the substrate. The Schottky electrode directly contacts the drift layer in such a manner that a lattice of the Schottky electrode is matched with a lattice of the drift layer.

In the above device, a boundary layer made of SiOx is not formed between the Schottky electrode and the drift layer.

Thus, the Schottky electrode and the surface of the drift layer are aligned in lattice so that atomic arrangement of the Schottky electrode is continuously connected to the surface of the drifty layer. Thus, both of the Schottky barrier height φb and the leak current density $I_R$ are improved.

Alternatively, the Schottky electrode may be formed from a metal grain, and the drift layer may be formed from a SiC matrix. The metal grain of the Schottky electrode and the SiC matrix of the drift layer are lattice matched.

Alternatively, the metal grain of the Schottky electrode may have a granular structure. In this case, oxygen is not introduced at the boundary between the Schottky electrode and the drift layer through a grain boundary, so that the atomic arrangement of the Schottky electrode is continuously connected to the surface of the drifty layer.

Alternatively, a ratio between a diameter of the metal grain of the Schottky electrode and a film thickness of the Schottky electrode may be smaller than 1.

Alternatively, the diameter of the metal grain of the Schottky electrode may be equal to or smaller than 100 nanometers.

Alternatively, the Schottky electrode may be made of a molybdenum film, and the molybdenum film may be oriented in a (110)-plane.

Alternatively, the Schottky electrode may be made of molybdenum, titanium, nickel, tungsten, gold, platinum or alloy of at least two of molybdenum, titanium, nickel, tungsten, gold and platinum, and the Schottky electrode may have a single-layered structure or a multi-layered structure.

Alternatively, the Schottky electrode may have a multi-layered structure of a plurality of metal films or alloy films. The multi-layered structure includes a lower layer and an upper layer, and a reactivity of the upper layer with respect to oxygen is lower than a reactivity of the lower layer with respect to oxygen. In this case, the lower layer is prevented from being oxidized.

Alternatively, the Schottky electrode may be made of metal, which includes an additive. Further, the additive may be silicon. In these cases, the grain of the Schottky electrode becomes a granular structure easily.

Alternatively, the SiC semiconductor device may further include: a second conductive type layer disposed in a surface portion of the drift layer. The second conductive type layer contacts the Schottky electrode so that a junction barrier Schottky diode is provided.

Alternatively, the substrate may be made of 4H—SiC, 6H—SiC, 3C—SiC or 15R—SiC, and the substrate may be an offset substrate so that an offset angle with respect to a (000-1) carbon plane or a (0001) silicon plane is four or eight degrees. Further, the Schottky electrode may be formed from a metal grain, and the drift layer may be formed from a SiC matrix. The metal grain of the Schottky electrode and the SiC matrix of the drift layer are lattice matched, and the metal grain of the Schottky electrode has a granular structure. Furthermore, a diameter of the metal grain of the Schottky electrode may be equal to or smaller than 100 nanometers, and a film thickness of the Schottky electrode may be in a range between 100 nanometers and 500 nanometers.

According to a second aspect of the present disclosure, a manufacturing method of a SiC semiconductor device having a Schottky barrier diode includes: preparing a substrate made of SiC and having a first conductive type, wherein the substrate includes a main surface and a rear surface; forming an ohnic electrode on the rear surface of the substrate; forming a drift layer on the main surface of the substrate, wherein the drift layer is made of SiC and has the first conductive type, and an impurity concentration of the drift layer is lower than the substrate; and forming a Schottky electrode on the drift layer after the forming of the ohmic electrode, wherein the Schottky electrode has a Schottky contact with a surface of the drift layer. The forming of the Schottky electrode includes: depositing the Schottky electrode at temperature equal to or lower than 150° C.; and annealing the Schottky electrode at temperature equal to or lower than 900° C.

In the above method, since the Schottky electrode is deposited at temperature equal to or lower than 150° C., the diameter of grains in the Schottky electrode becomes small, so that the grain has a granular structure. Further, since the annealing temperature of the Schottky electrode is equal to or lower than 900° C., the grain of the Schottky electrode is not changed from the granular structure to the columnar structure. Thus, the boundary layer made of SiOx is not formed between the Schottky electrode and the drift layer. Thus, the Schottky electrode and the surface of the drift layer are aligned in lattice so that atomic arrangement of the Schottky electrode is continuously connected to the surface of the drifty layer. Thus, both of the Schottky barrier height φb and the leak current density $I_R$ are improved.

Alternatively, the depositing of the Schottky electrode may be performed under a condition that a deposition rate is equal to or lower than 10.0 nm/min. In this case, the grain of the Schottky electrode has the granular structure.

Alternatively, the depositing of the Schottky electrode may be performed by an evaporation method.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A SiC semiconductor device having a Schottky barrier diode comprising:
    a substrate made of SiC and having a first conductive type, wherein the substrate includes a main surface and a rear surface;
    a drift layer made of SiC and having the first conductive type, wherein the drift layer is disposed on the main surface of the substrate and has an impurity concentration lower than the substrate;
    a Schottky electrode disposed on the drift layer and has a Schottky contact with a surface of the drift layer; and
    an ohmic electrode disposed on the rear surface of the substrate,
    wherein the Schottky electrode directly contacts the drift layer in such a manner that a lattice of the Schottky electrode is matched with a lattice of the drift layer.

2. The SiC semiconductor device according to claim 1,
    wherein the Schottky electrode is formed from a metal grain,
    wherein the drift layer is formed from a SiC matrix, and
    wherein the metal grain of the Schottky electrode and the SiC matrix of the drift layer are lattice matched.

3. The SiC semiconductor device according to claim 2,
    wherein the metal grain of the Schottky electrode has a granular structure.

4. The SiC semiconductor device according to claim 3,
    wherein a ratio between a diameter of the metal grain of the Schottky electrode and a film thickness of the Schottky electrode is smaller than 1.

5. The SiC semiconductor device according to claim 4, wherein the diameter of the metal grain of the Schottky electrode is equal to or smaller than 100 nanometers.

6. The SiC semiconductor device according to claim 1, wherein the Schottky electrode is made of a molybdenum film, and
wherein the molybdenum film is oriented in a (110)-plane.

7. The SiC semiconductor device according to claim 1, wherein the Schottky electrode is made of molybdenum, titanium, nickel, tungsten, gold, platinum or alloy of at least two of molybdenum, titanium, nickel, tungsten, gold and platinum, and
wherein the Schottky electrode has a single-layered structure or a multi-layered structure.

8. The SiC semiconductor device according to claim 1, wherein the Schottky electrode has a multi-layered structure of a plurality of metal films or alloy films,
wherein the multi-layered structure includes a lower layer and an upper layer, and
wherein a reactivity of the upper layer with respect to oxygen is lower than a reactivity of the lower layer with respect to oxygen.

9. The SiC semiconductor device according to claim 1, wherein the Schottky electrode is made of metal, which includes an additive.

10. The SiC semiconductor device according to claim 9, wherein the additive is silicon.

11. The SiC semiconductor device according to claim 1, further comprising:
a second conductive type layer disposed in a surface portion of the drift layer,
wherein the second conductive type layer contacts the Schottky electrode so that a junction barrier Schottky diode is provided.

12. The SiC semiconductor device according to claim 1, wherein the substrate is made of 4H—SiC, 6H—SiC, 3C—SiC or 15R—SiC, and
wherein the substrate is an offset substrate so that an offset angle with respect to a (000-1) carbon plane or a (0001) silicon plane is four or eight degrees.

13. The SiC semiconductor device according to claim 12, wherein the Schottky electrode is formed from a metal grain,
wherein the drift layer is formed from a SiC matrix,
wherein the metal grain of the Schottky electrode and the SiC matrix of the drift layer are lattice matched, and
wherein the metal grain of the Schottky electrode has a granular structure.

14. The SiC semiconductor device according to claim 13, wherein a diameter of the metal grain of the Schottky electrode is equal to or smaller than 100 nanometers, and
wherein a film thickness of the Schottky electrode is in a range between 100 nanometers and 500 nanometers.

* * * * *